United States Patent [19]

Reddy

[11] Patent Number: 5,525,918
[45] Date of Patent: Jun. 11, 1996

[54] PRE-SENSE AMPLIFIER FOR MONOLITHIC MEMORIES

[75] Inventor: Chitranjan N. Reddy, Milpitas, Calif.

[73] Assignee: Alliance Semiconductor Corporation, San Jose, Calif.

[21] Appl. No.: 364,130

[22] Filed: Dec. 27, 1994

[51] Int. Cl.[6] .............................. G01R 19/00; G11C 7/00
[52] U.S. Cl. ........................... 327/051; 327/564; 365/203
[58] Field of Search ................................ 327/51–57, 560, 327/198, 91, 94, 564, 565; 365/203

[56] References Cited

U.S. PATENT DOCUMENTS

| | | | |
|---|---|---|---|
| 3,949,381 | 4/1976 | Dennard et al. | 327/51 |
| 4,239,994 | 12/1980 | Stewart | 327/57 |
| 4,811,300 | 3/1989 | Lanfranca | 365/203 |
| 4,855,628 | 8/1989 | Jim | 327/57 |
| 4,932,002 | 6/1990 | Houston | 327/51 |
| 5,231,318 | 7/1993 | Reddy | 307/530 |

*Primary Examiner*—Toan Tran
*Attorney, Agent, or Firm*—Bradley T. Sako

[57] ABSTRACT

A pre-sense amplifier (10) is disclosed. The pre-sense amplifier (10) increases a low-going bit line signal from a cell column (24) by an amount approximately equal to the threshold voltage of an n-channel MOS transistor. The pre-sense amplifier (10) includes a first channel (12) and a second channel (14), each channel having a precharge/transfer transistor (16) and an output precharge transistor (18). The output precharge transistors (18) are clocked to pull the inputs to a sense amplifier (26) to a positive supply voltage. At the same time, the precharge/transfer transistors (16) precharge the bit lines of a cell column (24) to a voltage equal to the positive supply voltage less their threshold voltage. When the cell column (24) pulls one of the bit lines low, the corresponding precharge/transfer transistor (16) connects the bit line with the sense amplifier input, redistributing the charge across the bit line capacitance and the sense amplifier input capacitance. Because the bit line capacitance is much greater than the sense amplifier input capacitance, the redistributed charge creates voltage at the sense amplifier input approximately equal to the voltage that was precharged on the low-going bit line.

8 Claims, 2 Drawing Sheets

PRE-SENSE AMPLIFIER FOR MONOLITHIC MEMORIES

TECHNICAL FIELD

The present invention relates generally to semiconductor circuits for amplifying digital signals, and more specifically to circuits for amplifying output signals from semiconductor memory storage arrays.

BACKGROUND OF THE INVENTION

Data stored within semiconductor memories are generally capable of producing only very low level output signals. Typically a bit line is precharged to a high level, and then connected to the memory cell. In the case of dynamic random access memories (DRAMs) a storage capacitor discharges onto the bit line and a voltage difference is produced between the bit line and a dummy cell. In the case of static random access memories, a bit line and inverted bit line are precharged to a high state and then connected to a latch-type cell. The SRAM cell will discharge either the bit line or inverted bit line depending on whether the cell logic is high or low. This generates a voltage difference between the bit line (BIT) and inverted bit line ($\overline{BIT}$). In any event, the resulting voltage difference generated by the memory cell is a relatively small signal. In order to provide an adequate output signal for the data read from semiconductor memories, the low level outputs of the memory cells must be amplified.

Sense amplifiers are circuits designed to receive and amplify the low level signal that is output by a memory cell. In the prior art, it has been know to use a differential amplifier as a sense amplifier. The differential amplifier input receives the voltage difference from the memory cell and provides an amplified output. However, this solution does have drawbacks in that differential amplifiers have only a limited gain, and require relatively precise biasing conditions for accurate detection of low level signals.

U.S. Pat. No. 5,231,318, entitled DIFFERENTIAL LATCH SENSE AMPLIFIER and issued on Jul. 27, 1993 to the present inventor, discloses a more robust design that includes a pair of differential amplifiers; one composed of p-channel devices and one composed of n-channel devices. The differential amplifier pair has cross coupled common inputs and a common output. The common output is coupled to a latch formed by a pair of cross coupled n-channel devices.

Regardless of the improvements in sense amplifier design, sense amplifiers continue to be driven by the low level output from individual memory cells. Clearly, it would be desirable to provide a circuit which could boost the output signals from memory cells prior to applying them to the sense amplifier.

SUMMARY OF THE INVENTION

It is therefore an object of the present invention to provide a technique to increase the output signal from a memory cell, prior to applying the output signal to a sense amplifier.

It is a further object of the present invention to provide a technique of amplifying a low-going signal from a memory cell.

It is a further object of the present invention to provide a technique of precharging a sense amplifier input node to a first voltage, precharging a memory cell output node to a second voltage that is lower than the first voltage, and connecting the nodes as the cell output node goes low.

It is a further object of the present invention to provide a technique of transferring charge between a memory cell bit line capacitance and a sense amplifier input capacitance, to amplify a low-going signal on the bit line.

According to the invention a pre-sense amplifier is situated between at least one memory cell and a sense amplifier, and includes a first channel and a second channel. Each channel includes a precharging device, and a precharge/transfer device. The first channel is situated between a first bit line and a first sense amplifier input. Correspondingly, the second channel is situated between a second bit line and a second sense amplifier input. Utilizing the inherent capacitance of the bit lines, each bit line is precharged to a first voltage by its respective precharging device. In a similar manner, using the inherent input capacitance of the sense amplifier inputs, the precharge/transfer device precharges the sense amplifier to a second voltage that is higher than the first voltage. It is noted that the bit line capacitance is much greater than the input capacitance of the sense amplifier.

Depending upon the logic state of the cell, either the first or the second bit line will go low during a read operation. This low-going signal turns on the precharge/transfer device, which connects the low-going bit line with the sense amplifier input. Because the bit line capacitance is much larger than the input capacitance of the sense amplifier, the charge held on the sense amplifier input discharges into the bit line, resulting a voltage at the sense amplifier input that is approximately equal to the voltage of the bit line.

According to an aspect of the invention the precharge/transfer device is a single n-channel MOS transistor.

According to a further aspect of the invention the precharge device is a clocked pull-up transistor.

Further objects and advantages of the present invention will become clear to those skilled in the art in view of the description of the invention and the industrial applicability as described herein, and as illustrated in the several figures of the drawings.

DETAILED DESCRIPTION OF THE INVENTION

Figure 1:
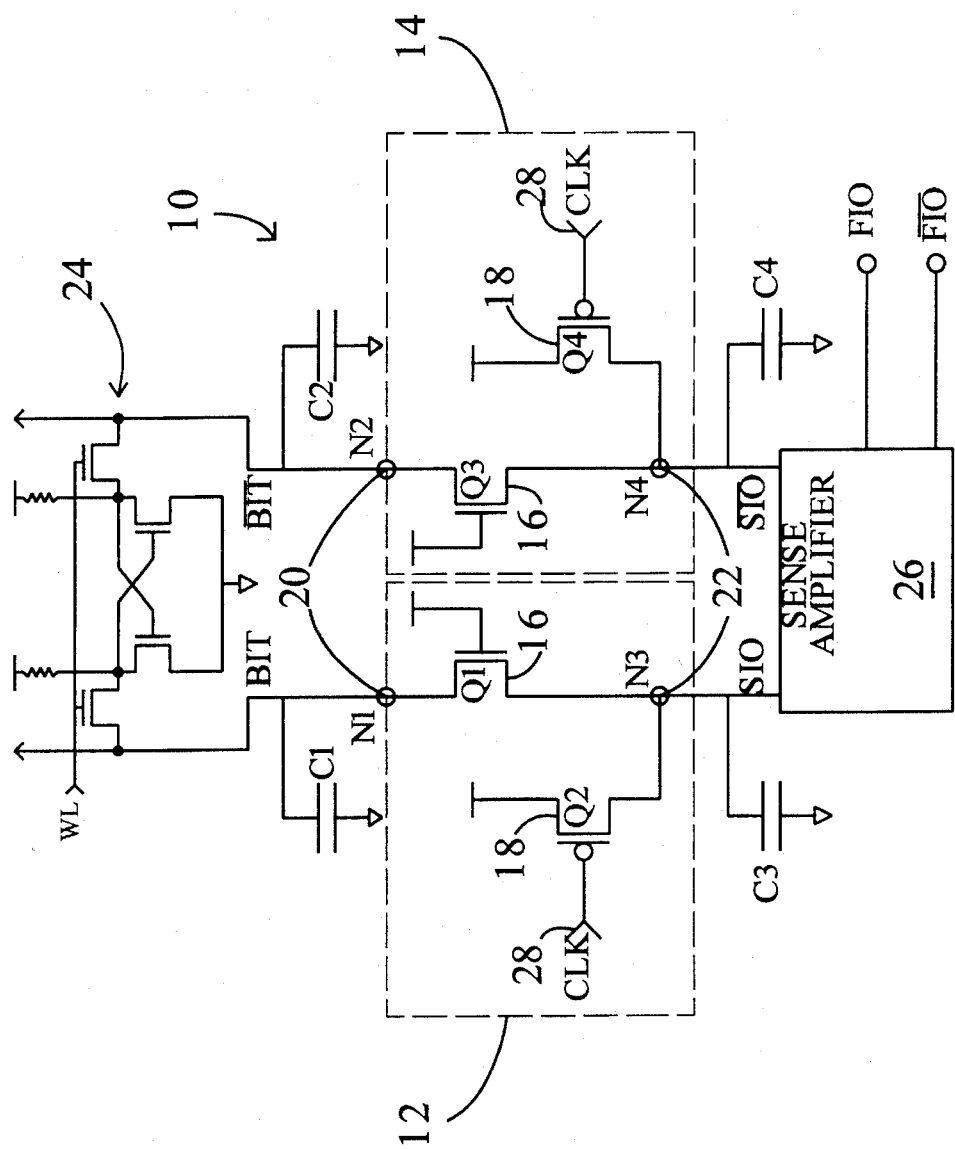
FIG. 1 is a block schematic diagram illustrating the present invention.

FIG. 1 shows a pre-sense amplifier 10, according to the present invention. As shown in the figure the pre-sense amplifier can be conceptualized as having a first channel 12 and a second channel 14. The first channel includes a precharge/transfer transistor 16, shown as Q1, and an output precharge transistor 18, shown as Q2. The second channel 14 mirrors the first channel 12 having precharge/transfer transistor Q3 16, and output precharge transistor Q4 18. The pre-sense amplifier includes two input nodes 20, (shown as N1 and N2), and two output nodes 22, (shown as N3 and N4).

The pre-sense amplifier 10 is disposed between a column of memory cells (cell column) 24 and a sense amplifier 26. In FIG. 1, the cell column 24 is illustrated by a representative SRAM cell. It is understood that the cell column is composed of a number of SRAM cells, each storing a bit of information. Each SRAM cell of the cell column 24 provides an output to a first column output line (BIT) and a second column output line ($\overline{\text{BIT}}$). When the SRAM cell is accessed, it will provide a drop in voltage ($v_d$) on either BIT or $\overline{\text{BIT}}$, according to the logic state of the stored bit. For the example set forth in FIG. 1, operation of the SRAM cell word line, set forth as (WL), will access the bit. Due to the number of SRAM cells within on the cell column 24, the bit lines (BIT and $\overline{\text{BIT}}$) have a relatively high capacitance. This line capacitance is represented fancifully in FIG. 1 as C1 and C2. Because memory architectures and operations are well known in the art, further details on the cell column operation 24 will not be discussed herein. While this detailed description sets forth the present invention 10 as is used in conjunction with a cell column 24 composed of SRAM cells, one skilled the art will recognize that the present invention may be employed in any semiconductor device employing sense amplifiers to amplify a low level binary signal, including dynamic random access memories (DRAMs), electrically erasable programmable memories (EEPROMs), and programmable logic devices (PLDs), to name a few.

The sense amplifier 26 provides two input nodes to the pre-sense amplifier, shown as a secondary input/output (SIO) and inverted secondary input/output ($\overline{\text{SIO}}$). The sense amplifier amplifies the voltage difference between SIO and $\overline{\text{SIO}}$ to provide an amplified output signal across its two output nodes, shown as final input/output (FIO) and inverted final input/output ($\overline{\text{FIO}}$). Just as the BIT and $\overline{\text{BIT}}$ lines have a line capacitance, the sense amplifier 26 also includes an inherent input capacitance. These are fancifully designated as C3 and C4 in FIG. 1. As it is very important to the invention, it should be noted that the capacitance of C3 and C4 is considerably smaller than that of C1 and C2 due to the relative differences in the amount of conductor area used in the layout of the bit lines (BIT and $\overline{\text{BIT}}$) in comparison to the layout of the input to the sense amplifier 26. In the preferred embodiment the sense amplifier employed is that disclosed as an alternate embodiment in U.S. Pat. No. 5,231,318, and issued to the present inventor on Jul. 27, 1993.

The present invention is connected to the bit lines of the cell column 24 by the precharge/transfer transistors 16 at the input nodes 20. The source of Q1 receives the BIT line at N1 and the source of Q3 receives the $\overline{\text{BIT}}$ line at N2. As is shown in the figure, Q1 and Q3 are n-channel MOS transistors connected by their respective gates to the positive supply voltage.

The present invention is connected to the sense amplifier 26 by the output nodes 22. The drain of Q1, the drain of Q2, and sense amplifier input (SIO) are connected at node N3. Similarly, the drain of Q3, the drain of Q4, and $\overline{\text{SIO}}$ are connected at node N4. As shown in FIG. 1, each output precharge transistor 18 (Q2 and Q4), is a p-channel MOS transistor connected by its respective source to the positive supply voltage. In addition, the gates of Q2 and Q4 receive the same clock signal (CLK) at a clock input node 28.

Figure 3:
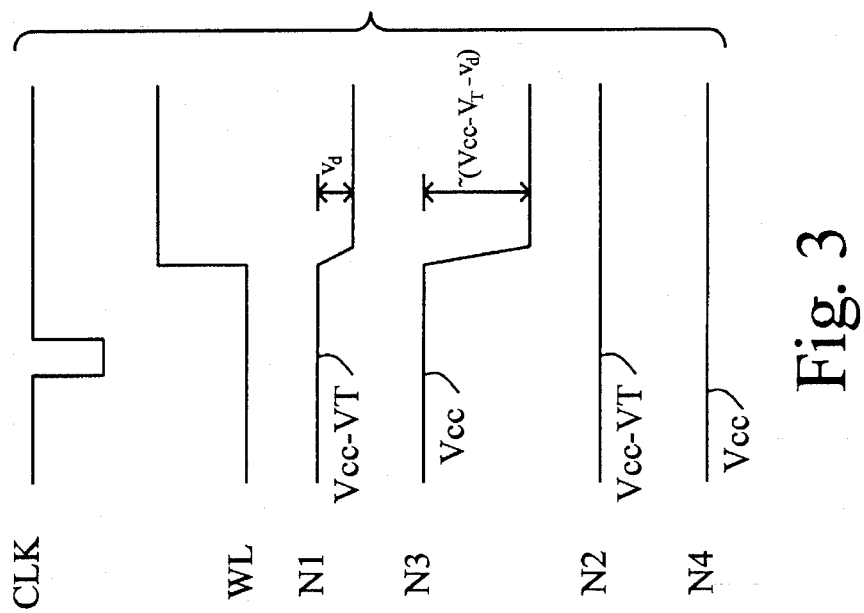
FIG. 3 is a timing diagram of signals related to the operation of the preferred embodiment.
Figure 2:
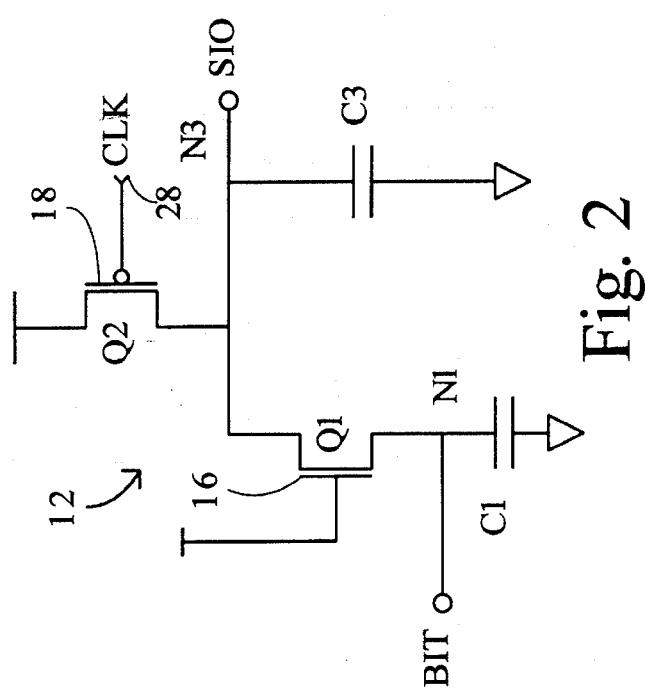
FIG. 2 is a schematic diagram illustrating one channel of the present invention.

Having described the components of the present invention, operation of the pre-sense amplifier 10 will now be described. Referring now to FIG. 2 and FIG. 3, the first channel 12 and accompanying timing signals are set forth. As illustrated in the timing diagram of FIG. 3, prior to any activity on the BIT or $\overline{\text{BIT}}$ lines, the CLK signal goes low, turning on Q2, and precharging C3 (and thus node N3) to the supply voltage (Vcc). At the same time transistor Q1 precharges C1 and node N1 to a lower precharge voltage (Vcc–$V_T$), where $V_T$ is the threshold voltage for Q1 (and Q3). As CLK goes high again, p-channel device Q2 is cut off. When C1 reaches Vcc–$V_T$, Q1 is turned off.

As illustrated in FIG. 3, following the precharge operation caused by the CLK signal, WL is activated, and the cell column 24 outputs a signal by pulling the voltage on a bit line down by the amount $v_d$. For the purposes of this description is assumed that it is the BIT line which goes low. It is understood that if the cell logic was in the opposite state, the second channel 14 would operate in the same manner as the first channel 12, as it would be the $\overline{\text{BIT}}$ line that would go low.

Figure 4:
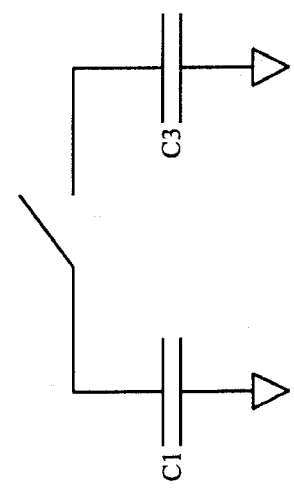
FIG. 4 is a schematic diagram of an equivalent circuit illustrating the operation of the present invention.

Referring once again to FIG. 3, it is shown that as the voltage at node N1 falls, Q1 is turned on, connecting nodes N1 and N3, and redistributing the charge held by C1 and C3. Thus, Q1 operates to both precharge the bit line, and transfer charge between the bit line and the sense amplifier input. The redistribution of charge can be represented by the circuit of FIG. 4. As set forth in FIG. 3, prior to –$v_d$ appearing on the BIT line, the voltage at node N1 is Vcc–$V_T$, and the voltage at N3 is Vcc. As –$v_d$ appears on BIT, Q1 is turned on, and nodes N1 and N3 are connected. The charge giving rise to the voltage at node N1 (Vcc–$V_T$–$v_d$) and N3 (yet) is then redistributed across C1 and C3. Following well-known charge conservation principles, the resulting voltage ($V_F$) at N3 is derived as follows.

$$C_1(Vcc - V_T - v_d) + C_3(Vcc) = C_1 V_F + C_3 V_F$$

$$V_F = \frac{C_1(Vcc - V_T - v_d)}{C_1 + C_3} + \frac{C_3(Vcc)}{C_1 + C_3}$$

As mentioned previously, for the case where C1 is the bit line capacitance and C3 is the input capacitance to the sense amplifier 26, C1 is greater than C3, and the following approximation can be made.

$$V_F \approx Vcc - V_T - v_d$$

Referring once again to FIGS. 1 and 3, it is shown that while bit line BIT falls by $v_d$, bit line $\overline{\text{BIT}}$ remains unchanged at its precharged voltage of Vcc–$V_T$. Due to the logic of the memory cell, no low-going signal appears on $\overline{\text{BIT}}$, and therefore Q3 does not conduct. Accordingly, node N4 also remains at its precharged voltage of Vcc. Thus, the total voltage difference received at the input of the sense amplifier 26 (across SIO and $\overline{\text{SIO}}$) is $\approx |V_T + v_d|$. When compared with the sense amplifier input voltage of the prior art, which is simply the output voltage of the cell row 24 ($v_d$), it is seen that the present invention provides a net voltage increase over the prior art of $\approx V_T$.

While the detailed description set forth herein discusses the present invention in a memory application, one skilled in the art would recognize that the present invention can be used to amplify any low-going, low level signal.

INDUSTRIAL APPLICABILITY

The pre-sense amplifier of the present invention is primarily intended for use in SRAM devices. However, the present invention may be utilized in any application wherein a low level digital signals needs to be amplified. The main area of improvement is an increase in output voltage approximating the threshold voltage of an n-channel MOS device ($\approx V_T$). This gain is accomplished with only a minimal number of devices.

Since the pre-sense amplifier of the present invention may be readily constructed using present fabrication methods, it is expected that it will be acceptable in the industry as a valuable addition to sensing circuits of all configurations. For these and other reasons, it is expected that the utility and industrial applicability of the invention will be both significant in scope and long-lasting in duration.

What I claim is:

1. A pre-sense amplifier for amplifying a low going bit signal, comprising:

precharging means for precharging a sense amplifier input node to a first voltage; and precharging and transfer means for precharging a bit line to a second voltage, the second voltage being lower than the first voltage, said precharging and transfer means being responsive to the low going bit signal for connecting the bit line to the input node and transferring charge from the input node to the bit line, decreasing the voltage at the input node.

2. The pre-sense amplifier of claim 1 wherein:

said precharging and transfer means is an n-channel MOS transistor connected by its source to the bit line, its drain to the input node and its gate to a positive power supply, the second voltage being the positive supply voltage less the threshold voltage of the n-channel MOS transistor.

3. The pre-sense amplifier of claim 1 wherein:

said first precharging means is a clocked precharge transistor connected by its source-drain path between the input node and the positive supply voltage, by its gate to a clock signal, and the first voltage is the positive supply voltage.

4. The pre-sense amplifier of claim 3 wherein:

said clocked precharge transistor is a p-channel MOS transistor.

5. A pre-sense amplifier, comprising:

a first channel and a second channel, the first channel being disposed between a first bit line and a first input node of a sense amplifier, the second channel being disposed between a second bit line and a second input node of the sense amplifier, each said channel including;

at least one precharge transistor of a first conductivity-type having a source-drain path and a gate, the source-drain path being connected between a supply voltage and the sense amplifier input node of its respective channel, and at least one precharge and transfer transistor having a source-drain path and a gate, the source-drain path being connected between the bit line and the sense amplifier input node of its respective channel, the gate of said precharge and transfer transistor being connected to the positive supply voltage, wherein a clock signal turns on the precharge transistor, precharging the sense amplifier node to the supply voltage and the bit line to a voltage equal to the supply voltage less the threshold voltage of the precharge and transfer transistor.

6. The pre-sense amplifier of claim 5 wherein:

the first conductivity-type is a p-channel type.

7. The pre-sense amplifier of claim 5 wherein:

the gate of said precharge transistor is connected to a clock signal.

8. The pre-sense amplifier of claim 5 wherein:

the precharge and transfer transistor is an n-channel MOS transistor.

* * * * *